(12) United States Patent
Akram et al.

(10) Patent No.: US 9,640,729 B2
(45) Date of Patent: May 2, 2017

(54) LED WITH STRESS-BUFFER LAYER UNDER METALLIZATION LAYER

(71) Applicant: KONINKLIJKE PHILIPS N.V., Eindhoven (NL)

(72) Inventors: Salman Akram, San Jose, CA (US); Quanbo Zou, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/902,001

(22) PCT Filed: Jun. 23, 2014

(86) PCT No.: PCT/IB2014/062535
§ 371 (c)(1),
(2) Date: Dec. 29, 2015

(87) PCT Pub. No.: WO2015/001446
PCT Pub. Date: Jan. 8, 2015

(65) Prior Publication Data
US 2016/0329468 A1    Nov. 10, 2016

Related U.S. Application Data

(60) Provisional application No. 61/842,431, filed on Jul. 3, 2013.

(51) Int. Cl.
*H01L 33/44* (2010.01)
*H01L 33/62* (2010.01)
(Continued)

(52) U.S. Cl.
CPC .......... *H01L 33/44* (2013.01); *H01L 33/0066* (2013.01); *H01L 33/0079* (2013.01);
(Continued)

(58) Field of Classification Search
CPC ..... H01L 33/62; H01L 33/44; H01L 33/0066; H01L 33/0079; H01L 33/486
See application file for complete search history.

(56) References Cited

U.S. PATENT DOCUMENTS

2009/0032975 A1* 2/2009 Do ...................... H01L 23/3171
257/784
2012/0061823 A1* 3/2012 Wu ...................... H01L 23/3157
257/737
(Continued)

FOREIGN PATENT DOCUMENTS

EP    2194586 A1    6/2010
EP    2528120 A2    11/2012
(Continued)

OTHER PUBLICATIONS

EPO as ISA, PCT/IB2014/062535, filed Jun. 23, 2014, "International Search Report and Written Opinion" dated Oct. 1, 2014, 12 pages.

*Primary Examiner* — Fazli Erdem
(74) *Attorney, Agent, or Firm* — Patent Law Group LLP; Brian D. Ogonowsky

(57) ABSTRACT

Semiconductor LED layers are epitaxially gown on a patterned surface of a sapphire substrate (10). The patterned surface improves light extraction. The LED layers include a p-type layer and an n-type layer. The LED layers are etched to expose the n-type layer. One or more first metal layers are patterned to electrically contact the p-type layer and the n-type layer to form a p-metal contact (32) and an n-metal contact (33). A dielectric polymer stress-buffer layer (36) is spin-coated over the first metal layers to form a substantially planar surface over the first metal layers. The stress-buffer layer has openings exposing the p-metal contact and the n-metal contact. Metal solder pads (44, 45) are formed over the stress-buffer layer and electrically contact the p-metal contact and the n-metal contact through the openings in the (Continued)

stress-buffer layer. The stress-buffer layer acts as a buffer to accommodate differences in CTEs of the solder pads and underlying layers.

13 Claims, 3 Drawing Sheets

(51) Int. Cl.
*H01L 33/48* (2010.01)
*H01L 33/00* (2010.01)

(52) U.S. Cl.
CPC ............ *H01L 33/486* (2013.01); *H01L 33/62* (2013.01); *H01L 2933/0016* (2013.01); *H01L 2933/0025* (2013.01); *H01L 2933/0066* (2013.01)

(56) References Cited

U.S. PATENT DOCUMENTS

| 2013/0109169 A1* | 5/2013 | Wang | H01L 23/3192 438/613 |
| 2013/0320382 A1 | 12/2013 | Kojima et al. | |

FOREIGN PATENT DOCUMENTS

| WO | 2012032803 A1 | 3/2012 |
| WO | 2012131807 A1 | 10/2012 |
| WO | 2012157150 A1 | 11/2012 |
| WO | 2013084103 A1 | 6/2013 |

* cited by examiner

LED WITH STRESS-BUFFER LAYER UNDER METALLIZATION LAYER

CROSS-REFERENCE TO RELATED APPLICATIONS

The present application is a §371 application of International Application No. PCT/IB2014/062535 filed on Jun. 23, 2014 and entitled "LED with Stress-Buffer Layer Under Metallization Layer," which claims the benefit of U.S. Provisional Application Ser. No. 61/842,431, filed Jul. 3, 2013. Both PCT/IB2014/062535 and U.S. 61/842,431 are incorporated herein.

FIELD OF THE INVENTION

This invention relates to packaging light emitting diodes (LEDs) and, in particular, to a stress buffer layer between the LED semiconductor layers and a solder pad metallization layer.

BACKGROUND

Thin-Film Flip-Chip (TFFC) LEDs have anode and cathode contacts on the bottom surface, opposite the light emitting surface. Therefore, such TFFC LEDs utilize the whole top die area surface for light output, since top-side (light-output side) metallization for a wire-bond is not necessary. However, with TFFC LEDs, die-level processes, including sapphire substrate lift-off (for GaN based LEDs) and epitaxial layer (EPI) roughening (to improve light extraction), are typically used, which significantly increase the packaging cost. It would be beneficial to not require the sapphire substrate to be removed, while still achieving good light output extraction.

Traditional TFFC LEDs have a rigid dielectric layer formed on the LED semiconductor layers that exposes portions of the p and n-type semiconductor layers. Then, a relatively thin, patterned metal layer (or layers) is deposited over the dielectric layer to directly contact the p and n-type semiconductor layers to create an ohmic contact between the metal and the p and n-type semiconductor layers. Much thicker metal pads (also comprising various metal layers) are then formed over the thin ohmic-contact metal layer(s), such as by plating, for use as the LED's solder pads for mounting the LED to a printed circuit board or other substrate. Solder bumps may then be deposited on the solder pads.

A problem with such traditional TFFC LEDs and processes is that there are stresses between the semiconductor layers, thin metal layer(s), and thick pad layers, such as due to mismatched coefficients of thermal expansion (CTE). Therefore, heat cycling of the LEDs, such as during operation or processing, creates stress that may cause the metal layers to delaminate from each other and from the semiconductor layers, or cause cracking of brittle layers at stress concentration points, which may cause failure. It would be beneficial to provide a technique to reduce such stress to increase the reliability of the LEDs.

Another problem with traditional TFFC LEDs and processes is that the surface on which the thick solder pads is formed is not planar. Therefore, it is difficult to obtain flat solder pads of uniform thickness. Flat solder pads with uniform thickness are beneficial for electrical and thermal conduction between the LED and the printed circuit board or other substrate. It would be beneficial to provide a technique to planarize the "bottom" surface of the LED structure prior to depositing (e.g., plating) the solder pads.

SUMMARY

One embodiment of the present invention solves all the above problems by using a wafer-level-chip-scale-package (WLCSP) process that patterns the sapphire substrate for improved light extraction and forms a stress-buffer layer between the thick metal solder pads and the thin metal that ohmically contacts the semiconductor layers. The stress-buffer layer also planarizes the bottom surface of the LED prior to the thick solder pads being formed. This helps create flatter and more uniform solder pads for improved electrical and thermal conductivity. By keeping the sapphire substrate as part of the packaged LED, there is a beneficial rigid mechanical support for the thin LED layers in the final package. The cost of removing the substrate is also avoided.

The wafer-level processes described herein reduce the total fabrication cost of device, improve reliability, and maintain the best over-all performance electrically, thermally, and optically.

BRIEF DESCRIPTION OF DRAWINGS

Elements that are the same or similar are labeled with the same numeral.

DETAILED DESCRIPTION

FIGS. 1-8 illustrate a wafer-level process flow in accordance with one embodiment of the invention. Only a single LED area on a much larger wafer is shown for simplicity. Each step shown for an illustrated LED area is applied to all of the LED areas on the large wafer.

Figure 1:
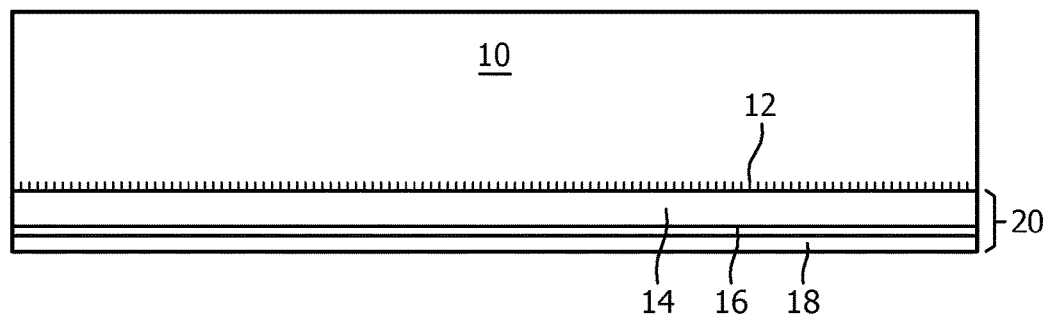
FIG. 1 is a cross-sectional view of a portion of a patterned sapphire substrate having LED layers epitaxially grown over the patterned surface.

With reference to FIG. 1, the process flow to create a wafer of LEDs starts with a patterned sapphire substrate (PSS) 10. The substrate 10 will typically have a disc shape and be substantially transparent to the light emitted by the LED. One surface 12 is roughened (patterned) such as by grinding, "sand" blasting, chemical etching, plasma etching, or other roughening process. The roughening improves light extraction by reducing total internal reflection (TIR). The substrate 10 surface 12 may be patterned in any orderly or random fashion to improve light extraction.

Roughening the semiconductor layer light emitting surface of a conventional flip-chip LED, after removal of the sapphire substrate, is commonly performed. In contrast, the present process retains the sapphire substrate and roughens its growth surface.

In one embodiment, conventional GaN-based semiconductor LED layers are then epitaxially grown over the roughened surface 12 of the substrate 10. In one embodiment, n-type layers 14 are grown over the surface 12, followed by an active layer 16 and p-type layers 18. In one embodiment, the active layer 16 produces blue light when the LED is energized.

For simplicity, the various semiconductor LED layers are shown as a single LED layer 20 in the remaining figures.

Figure 2:
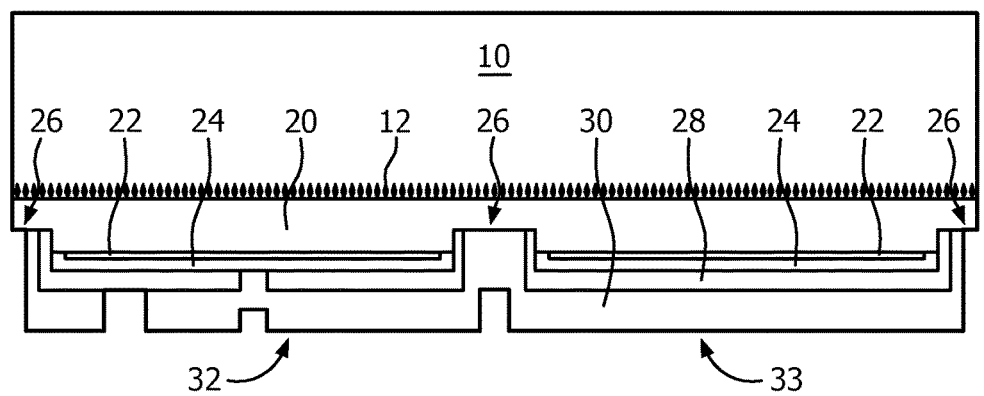
FIG. 2 illustrates distributed metal contacts making ohmic contact to the p and n-type LED layers.

In FIG. 2, a standard process flow is performed to form the thin metal ohmic contacts. A thin reflective metal layer 22, such as silver, nickel, or an alloy, or multiple layers, is deposited on the surface of the p-type layer, such as by sputtering, and patterned. The metal layer 22, after annealing, creates an ohmic contact with the p-type layer.

A metal layer 24 of titanium, tungsten, or any alloy is then deposited over the metal layer 22 and patterned. The metal layer 24 improves adhesion to a subsequent metal layer. The layer 24 may also serve as a barrier layer to block the migration of atoms across layers. The metal layer 24 may be referred to as an interface layer. The thickness of the combination of metal layers 22 and 24 will typically be less than one micron.

The LED layer 20 is etched at locations 26 to remove portions of the p-type layers and active layer to expose the n-type layer.

A dielectric layer 28 is then deposited over the surface and into the openings at locations 26. Dielectric layer 28 is then patterned to expose portions of the metal layer 24 and to expose the n-type layers at locations 26.

A thicker metal layer 30, such as aluminum, nickel, a titanium-tungsten alloy, copper, gold, or alloys, is then deposited over the dielectric layer 28 and into the openings to ohmically contact the p-type layers and n-type layers. The metal layer 20 may be stacked layers. The metal layer 30 is then patterned to separate the p-metal contacts 32 from the n-metal contacts 33. The metal layer 30 may be a few microns thick.

The above metallization process may be conventional so further details are not required for one skilled in the art.

The metal connections to the p-type layers and n-type layers can be distributed over the entire LED area to more uniformly distribute the current across the LED. This will provide a substantially uniform light emission from the top surface of the LED.

The resulting metal layer 30 is not planar due to the metal layer 30 filling the openings and being etched. If the metal layer 30 were plated to form the metal solder pads, the solder pads would not be planar and uniformly thick. It is desirable to provide planar and uniformly thick solder pads for good electrical and thermal conductivity.

Figure 3:
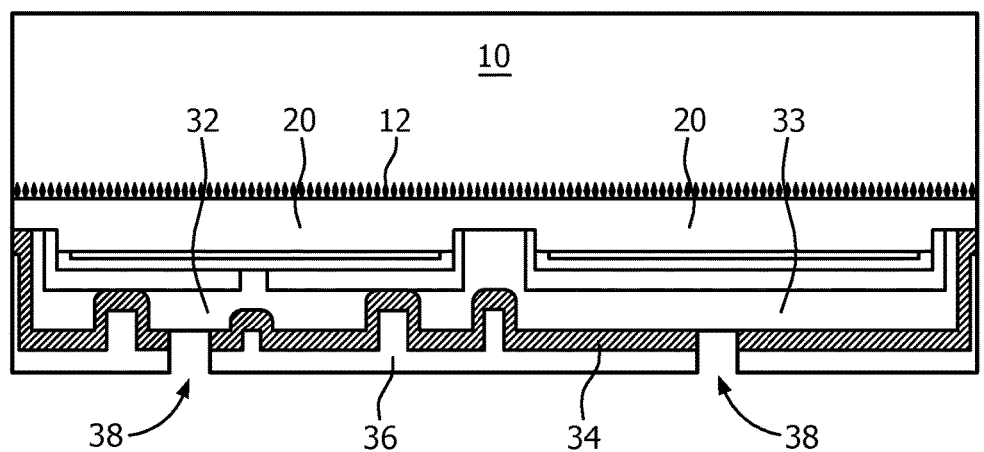
FIG. 3 illustrates a planar stress-buffer layer deposited over the distributed metal contacts and patterned to expose portions of the distributed metal contacts. An optional passivation layer is also shown between the stress-buffer layer and the distributed metal contacts for creating a seal and blocking migration of metal atoms from the subsequently formed metal solder pads.

In FIG. 3, an optional thin passivation layer 34, such as PECVD SiNx, is deposited to block aluminum atom migration into the semiconductor layers from a subsequently formed solder pad. Depending on the metals used for the layers 22, 24, and 30 and the solder pads, the passivation layer 34 may not be needed. The passivation layer 34 may also be used for hermetic sealing against any moisture or harsh/corrosive environment. A typical thickness of the passivation layer 34 may be 0.5-1.5 um, and preferably 0.8-1.2 um. SiNx is a known barrier layer for moisture, while SiOx (or SiO2) or a SiOx/SiNx mixture may also be used.

Since the passivation layer 34 is formed by a PECVD process, it will be fairly uniform over the non-planar surface, so its surface will not be planar.

Next, in FIG. 3, a stress-buffer-layer (SBL) 36, such as BenzoCycloButene (BCB), is coated onto the surface (e.g., by spin-on coating). The SBL 36 is a dielectric polymer deposited as a liquid. Therefore, the deposition process forms a planar layer of the SBL 36. Deposition by evaporation may also be used. In one embodiment, the thickness of the SBL layer 36 is 1-3 um.

Before the SBL 36 is cured by heating, the SBL 36 is masked, exposed, and developed to form one or more via openings 38, which exposes the passivation layer 34. Photo-BCB is commercially available and has the properties of a photoresist. The SBL 36 is then cured. A passivation layer 34 etch is performed by using the SBL 38 as a masking layer. This exposes the p-metal contact 32 and the n-metal contact 33.

The typical thermal conductivity of suitable SBL 36 materials, such as BCB, PBO: polybenzoxazole, or PI: polyimide, is about 0.3 W/m·K. Since the SBL 36 is thin, this is sufficient for very good thermal conductivity for a 1 mm$^2$ die size. A typical SBL 36 thickness after cure and passivation etch should be a minimum of ~1 um to provide adequate step coverage, which is enough for electrical breakdown strength.

Note that the etch step to etch into the LED layers 20 also creates a trench surrounding each LED area that is at least partially filled with the SBL 36 and passivation layer 34 for added protection/sealing of the LED.

Figure 4:
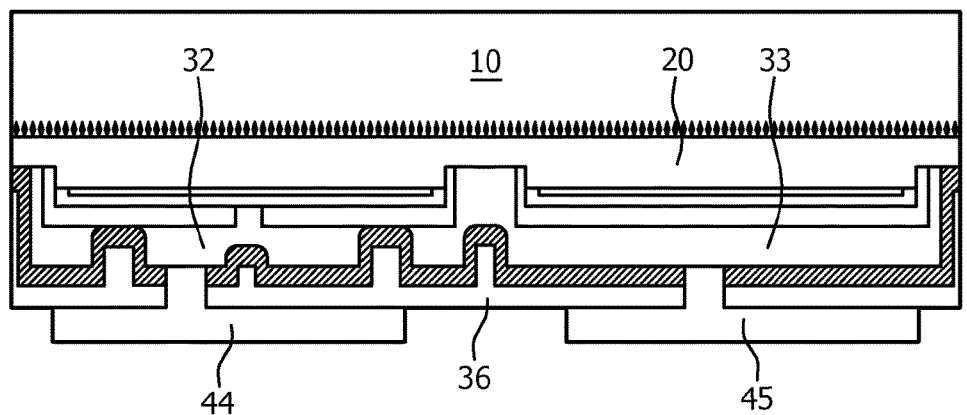
FIG. 4 illustrates relatively thick metal solder pads plated over the planar stress-buffer layer and exposed portions of the distributed metal contacts.

In FIG. 4, a metal redistribution layer (RDL) is deposited that is patterned to form solder pads 44 and 45 electrically connected to the p-type and n-type LED layers 20. This can be done by a plating-through-photoresist approach as follows. First, a seed metal layer stack (e.g., TiW/Cu 1000/2000 Angstroms thick) is deposited such as by sputtering or evaporation, followed by lithography (photoresist coating, exposure, and development of photoresist) to expose only those areas to be plated. The exposed RDL stack is then electro-plated, such as with Cu/Ni/Au to a thickness of 2-20 um/2 um/0.3 um. The photoresist is stripped, followed by etching the exposed seed metal stack, resulting in the structure of FIG. 4. The Ni is used as a solder barrier layer and the Au is used as a solder wetting layer. Plating is a well know process for forming thick solder pads.

Alternatively, the RDL can be deposited and patterned using a patterned etch or lift-off approach, with added material/process cost.

By providing the SBL 36, the surface is planarized so that the resulting solder pads 44/45 are fairly flat and uniformly thick to evenly spread heat. Providing flat and uniformly thick solder pads 44/45 improves the electrical and thermal conductivity from the LED layers 20 to the heat sink/substrate that the LED will be ultimately mounted on for operation. At this stage, the wafer can be tested.

The use of the stress-butter (SBL) 36 relieves stress between the solder pads 44/45 and the underlying layers caused by different CTEs of the materials, reducing the possibility of delamination and reducing the possibility of cracking of brittle layers (e.g. layer 20) at stress concentration points, which may cause failure. For example, the solder pads 44/45 may expand at a different rate than the underlying material and may either shift with respect to the SBL 36 or deform the SBL 36. However, even with such different CTEs, the contact points between the solder pads 44/45 and the p-metal contact 32 and n-metal contact 33 are not broken since the stress has been relieved by the SBL 36. If the SBL 36 was not planar (flat and smooth), the lateral adhesion of the solder pads 44/45 to the SBL 36 would be much greater, reducing the effectiveness of the SBL 36. For some SBL 36 materials, such as BCB, the SBL 36 may be hard cured or soft cured to retain a target elasticity so as to deform without delaminating from the solder pads 44/45 in the event of different expansions of the materials. The polymer SBL 36 will typically be more elastic than a non-polymer silicon dioxide oxide layer or a silicon nitride layer typically used as a dielectric.

As previously mentioned, the SBL 36 also improves the quality of the solder pads 44/45 by providing a planarized surface, and the SBL 36 also adds a barrier layer for reducing contamination. The SBL 36 is very thin and is a fairly good conductor of heat, so thermal conduction between the LED and the heat sink is not significantly reduced by the SBL 36.

An optimized design or layout provides optimized thermal performance. For instance, a very good thermal resistance Rth from the metal/semiconductor junction to the solder bumps 48A and 48B (FIG. 5) of 2K/W has been achieved for a 1 mm$^2$ die.

Figure 5:
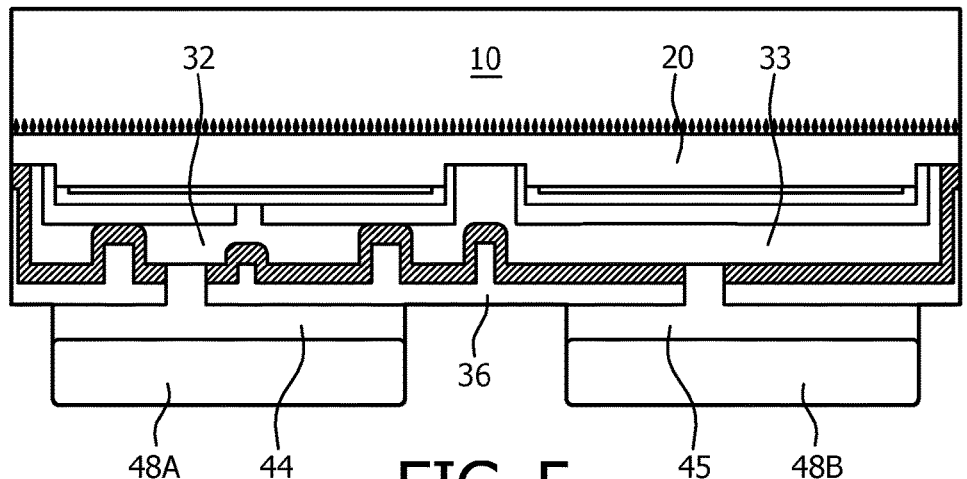
FIG. 5 illustrates solder bumps deposited on the metal solder pads.

As shown in FIG. 5, solder bumps 48A and 48B may then be deposited on the solder pads 44 and 45 using conventional techniques. Wafer-level solder bumping can be performed by an electroplating or PVD process with a patterned etch, or performed using a deposition and lift-off technique, or performed using screen printing, or performed using solder balls and a pick and place technique, or performed using any other standard bumping process. Such techniques are well known and do not need to be described in detail. Therefore, the solder bumps 48A and 48B may be flat or rounded. In order to reduce die-attach height, improve thermal conductivity, and achieve lower cost if AuSn or other expensive eutectic solder materials are used, the solder bumps 48A and 48B should be thin and uniformly coat the solder pads 44/45. The thickness range of the solder bumps 48A and 48B can be 1-100 um, and preferably 5-10 um. The solder bumps 48A and 48B may be Au, AuSn, or any other suitable metal or alloy.

The sapphire substrate 10 may be thinned at this stage and provided with a desired surface texture, such as by grinding and/or blasting, to reduce the LED height and improve light output. The target substrate 10 thickness can vary depending upon die size, such as from 10 to 1000 um, and preferably 200-400 um. The suitability of thicknesses of 100-400 um has been successfully demonstrated using a conventional back-grinding procedure (wafer mounted on a tape film or a frame) without the need for a wafer support system. However, for a target sapphire thickness of less than 100 um, a wafer-support system may be needed to avoid breakage/cracking during grinding.

Figure 6:
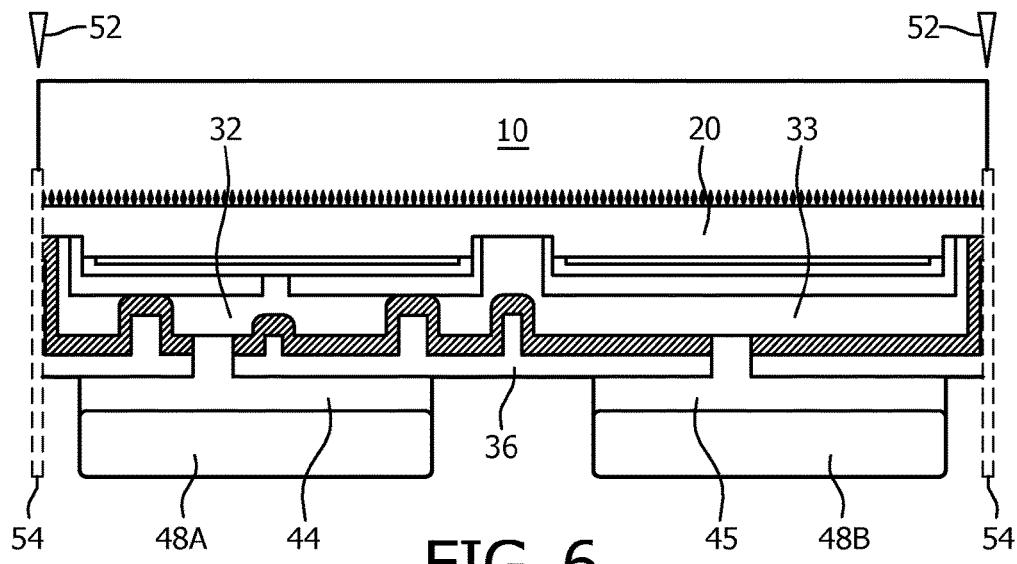
FIG. 6 illustrates the substrate being singulated by laser scribing and breaking.

Finally, as shown in FIG. 6, the wafer is singulated into individual LEDs (dice). This has been conducted by laser scribe and break for sapphire thicknesses of 80-300 with die sizes of 0.7-1.4 mm in side-length with excellent scribe and break yield loss of <<0.5%. The laser scribe of the substrate 10 is represented by the blades 52, and the break lines are represented by the dashed lines 54. The edges of the singulated LEDs are relatively precise and vertical.

By retaining the sapphire substrate 10 on the final LED, processing cost is saved by not having to remove the substrate 10. Yield is also increased.

In case a much thicker (e.g., >400 um) sapphire substrate 10 is needed, a combination of mechanical sawing and laser scribe and break works well, but at a reduced throughput due to the slow sawing speed (typically ~1 mm/s for minimized chipping).

Figure 7:
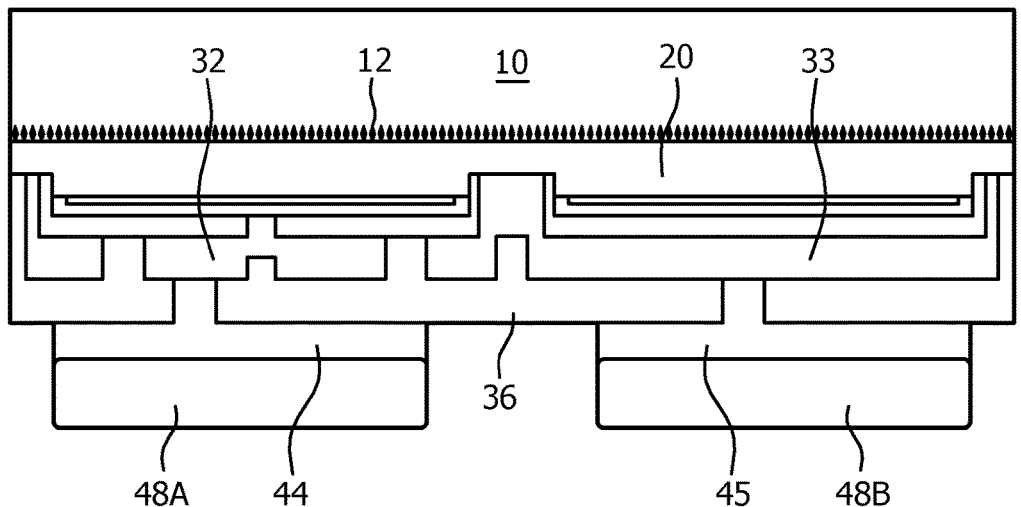
FIG. 7 illustrates a single LED after being singulated using the singulation method of FIG. 6. The optional passivation layer is eliminated in FIG. 7.

FIG. 7 illustrates the singulated LED without the optional passivation layer 34 (compare with FIG. 3).

Figure 8:
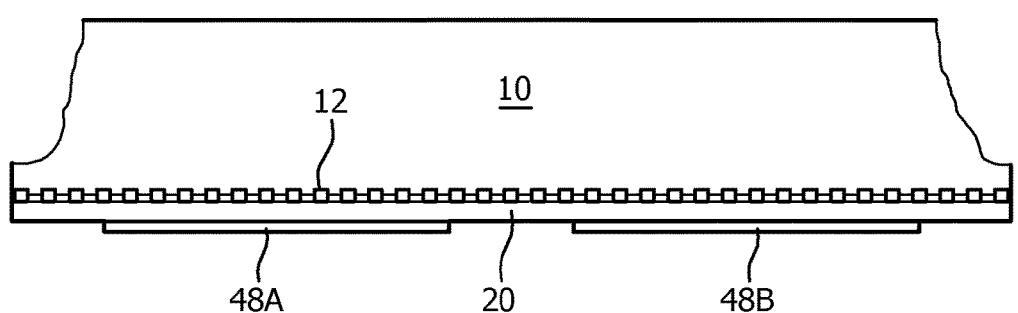
FIG. 8 illustrates a single LED, with the metal layers simplified, after being singulated using a combination of mechanical sawing (for the sapphire substrate) and scribing and breaking (for the LED layers), resulting in the edges of the substrate being roughened and the substrate narrowed.

FIG. 8 illustrates a simplified LED after being singulated by a combination of mechanical sawing of the substrate 10 and laser scribe and break of the LED layer 20. As a result, the sapphire side of the die is narrowed on each side (by half the width of the saw blade) so that the LED layer 20 extends beyond the substrate 10. This may be advantageous if the substrate 10 (the light emitting surface) is later coated with a phosphor since the sides will be coated. Also, the rough edges of the substrate 10 may improve light extraction.

In one embodiment, the singulated LEDs are mounted on a submount wafer by bonding the LED solder pads to pads on the top surface of the submount wafer. A pick and place machine positions the LEDs on the submount, followed by a heating step or an ultrasonic bonding step to bond the LED solder pads to the submount pads. The LEDs are then further processed on a wafer scale, such as being individually encapsulated by a molded silicone lens and/or covered with a phosphor (before or after encapsulation by the lens). The lens material itself may also be infused with phosphor powder. The phosphor may, for example, convert the blue LED light to white light. The submount wafer is then singulated. The submount has robust solder pads on its bottom surface that are electrically connected with vias to the LED solder pads. Alternatively, the LEDs may be directly mounted on printed circuit boards.

A final cumulative yield after die-attach, phosphor deposition, and dome-lens build has been >99%.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a substantially transparent growth substrate;
   light emitting diode (LED) layers disposed on the substrate, the LED layers including a p-type layer and an n-type layer, the n-type layer being between the p-type layer and the growth substrate, wherein the LED layers are etched to expose the n-type layer for electrically connecting to an n-metal contact, wherein the etch also creates a trench surrounding the device;
   a metal contact layer electrically contacting the p-type layer to form a p-metal contact;
   a first dielectric layer formed over the metal contact layer that contacts the p-type layer, the first dielectric layer having a first opening that exposes the n-type layer, the first dielectric layer having a second opening that exposes the metal contact layer that contacts the p-type layer;
   a first metal layer that contacts the metal contact layer for electrical connection to the p-type layer;
   a second metal layer that contacts the n-type layer through the first opening in the first dielectric layer for electrical connection to the n-type layer, wherein the first metal layer and the second metal layer are not planar;

a dielectric polymer stress-buffer layer disposed over the first metal layer, the second metal layer, the first dielectric layer, and the p-metal contact, the stress-buffer layer forming a substantially planar surface, the stress-buffer layer having two or more openings exposing a portion of the first metal layer and the second metal layer, wherein the stress-buffer layer at least partially fills the trench; and metal solder pads disposed over the stress-buffer layer, wherein the metal solder pads are electrically connected to the first metal layer and the second metal layer through the openings in the stress-buffer layer, the metal solder pads being thicker than the first metal layer and the second metal layer.

2. The device of claim 1 wherein the stress-buffer layer is elastic so as to deform when the metal solder pads expand at a different rate than their underlying materials when heat is applied.

3. The device of claim 1 wherein the stress-buffer layer comprises BenzoCycloButene (BCB).

4. The device of claim 1 wherein the growth substrate has a growth surface on which the LED layers are epitaxially grown, wherein the growth surface is patterned prior to growing the LED layers.

5. The device of claim 1 further comprising a passivation layer between the stress-buffer layer and the p-metal contact and the n-metal contact.

6. The device of claim 1 wherein the device is a flip-chip LED.

7. The device of claim 1 further comprising solder bumps on the solder pads.

8. The device of claim 1 wherein the substrate comprises sapphire and the LED is GaN based.

9. The device of claim 1 wherein the one or more metal contact layers comprise a metal contact layer in physical contact with one of the p-type layer and the n-type layer, and an interface layer between the contact layer and the solder pads.

10. The device of claim 1 wherein the solder pads comprise multiple metal layers.

11. A method for forming a light emitting device comprising:

epitaxially growing light emitting diode (LED) layers on a substantially transparent growth substrate, the LED layers including a p-type layer and an n-type layer the n-type layer being between the p-type layer and the growth substrate;

etching the LED layers to expose the n-type layer for electrically connecting to an n-metal contact, wherein the etch also creates trench surrounding the device;

depositing and patterning a metal contact layer electrically contacting the p-type layer to form the p-metal contact;

forming a first dielectric layer over the metal contact layer that contacts the p-type layer, the first dielectric layer having a first opening that exposes the n-type layer, the first dielectric layer having a second opening that exposes the metal contact layer that contacts the p-type layer;

forming a first metal layer that contacts the metal contact layer for electrical connection to the p-type layer;

forming a second metal layer that contacts the n-type layer through the first opening in the first dielectric layer for electrical connection to the n-type layer, wherein the first metal layer and the second metal layer are not planar;

depositing a dielectric polymer stress-buffer layer over the first metal layer, the second metal layer, the first dielectric layer, and the p-metal contact, the stress-buffer layer forming a substantially planar surface, the stress-buffer layer having two or more openings exposing a portion of the first metal layer and the second metal layer, wherein the stress-buffer layer at least partially fills the trench; and forming metal solder pads over the stress-buffer layer, the metal solder pads electrically contacting the first metal layer and the second metal layer through the openings in the stress-buffer layer, the metal solder pads being thicker than the first metal layer and the second metal layer.

12. The method of claim 11 wherein the stress-buffer layer is elastic so as to deform when the metal solder pads expand at a different rate than their underlying materials when heat is applied.

13. The method of claim 11 wherein the stress-buffer layer comprises BenzoCycloButene (BCB).

* * * * *